(12) United States Patent
Kawakami et al.

(10) Patent No.: US 10,550,281 B2
(45) Date of Patent: Feb. 4, 2020

(54) POLYMER COMPOUND, SURFACE TREATMENT AGENT, LAMINATED BODY USING SURFACE TREATMENT AGENT, TRANSISTOR, METHOD FOR MANUFACTURING LAMINATED BODY

(71) Applicant: NIKON CORPORATION, Tokyo (JP)

(72) Inventors: Yusuke Kawakami, Yokohama (JP); Shohei Koizumi, Atsugi (JP); Takashi Sugizaki, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 94 days.

(21) Appl. No.: 15/659,838

(22) Filed: Jul. 26, 2017

(65) Prior Publication Data

US 2017/0321079 A1 Nov. 9, 2017

Related U.S. Application Data

(63) Continuation of application No. PCT/JP2016/061571, filed on Apr. 8, 2016.

(30) Foreign Application Priority Data

Apr. 10, 2015 (JP) .................. 2015-81164

(51) Int. Cl.
| | |
|---|---|
| C09D 133/14 | (2006.01) |
| C08F 20/36 | (2006.01) |
| C23C 18/20 | (2006.01) |
| C08F 20/06 | (2006.01) |
| H05K 3/18 | (2006.01) |
| H05K 3/38 | (2006.01) |

(52) U.S. Cl.
CPC ............ *C09D 133/14* (2013.01); *C08F 20/06* (2013.01); *C08F 20/36* (2013.01); *C23C 18/20* (2013.01); *H05K 3/181* (2013.01); *H05K 3/387* (2013.01)

(58) Field of Classification Search
CPC ....... C09D 133/14; C08F 20/36; C08F 120/36
See application file for complete search history.

(56) References Cited

U.S. PATENT DOCUMENTS 9,217,050 B2 * 12/2015 Fornof .................. C09J 4/00
2013/0316286 A1 11/2013 Nakayama

FOREIGN PATENT DOCUMENTS

| JP | 08146608 A | * | 6/1996 |
|---|---|---|---|
| JP | 2000-261128 | | 9/2000 |
| JP | 2002-265531 | | 9/2002 |
| JP | 2006-251478 | | 9/2006 |
| JP | 2013-149860 | | 8/2013 |
| WO | WO 2012/105321 A1 | | 8/2012 |
| WO | WO 2013/151739 A1 | | 10/2013 |
| WO | WO-2013151739 A1 | * | 10/2013 |

OTHER PUBLICATIONS

Macromol. Rapid Commun., "Polymer Brushes . . . pH response"; 2011; 32; pp. 1699-1703 (Year: 2011).*
Maekawa et al; JP 08-146604; Jun. 1996 (Year: 1996).*
Photogeneration of Organic bases from o-nitrobenzyl-derived carbamates; JACS; vol. 113, pp. 4303-4313 (Year:1991).*
International Search Report dated Jul. 5, 2016 in corresponding International Application PCT/JP2016/61571, filed Apr. 8, 2016.
Written Opinion of the International Search Authority dated Jul. 5, 2016 in corresponding International Application No. PCT/JP2016/61571.
Chinese Office Action dated Oct. 15, 2018 in corresponding Chinese Patent Application No. 201680006157.2.
Jiaxi Cui et al., "Polymer Brushes with Phototriggered and Phototunable Swelling and pH Response", Macromolecular Rapid Communications, 2011, vol. 32, pp. 1699-1703.

* cited by examiner

*Primary Examiner* — Karuna P Reddy

(57) ABSTRACT

Provided is a compound which is excellent terms of stability and tight adhesion to substrates and on which wiring can be formed by electroless plating. The compound is a high-molecular-weight compound having a constituent unit represented by the following formula (1). [In formula (1), R1 represents a hydrogen atom or a methyl group, m is an integer of 2-20, and Q represents a photosensitive leaving group].

10 Claims, 9 Drawing Sheets

UV EXPOSURE

POLYMER COMPOUND, SURFACE TREATMENT AGENT, LAMINATED BODY USING SURFACE TREATMENT AGENT, TRANSISTOR, METHOD FOR MANUFACTURING LAMINATED BODY

CROSS-REFERENCE TO RELATED APPLICATIONS

This application is a continuation application, under 35 U.S.C. § 111(a), of International Application No. PCT/JP2016/61571, filed Apr. 8, 2016, and based upon and claiming the benefit of foreign priority from Japanese Patent Application 2015-81164, filed Apr. 10, 2015, the entire contents of which are incorporated herein by reference.

TECHNICAL FIELD

The present invention relates to a compound that is used for electroless plating formation.

BACKGROUND ART

As a method for forming a fine wiring by electroless plating, for example, Patent Literature 1 discloses a method where a resin base surface with excimer light in a desired pattern, the resin base is then brought into contact with a silane coupling agent having an amino group or an amino-modified reactive silicon oil, a receptive layer for trapping/immobilizing a catalyst for initiating an electroless plating reaction is formed on the part irradiated with the excimer light, and a nickel/phosphorus plating layer is formed on the receptive layer by electroless plating.

CITATION LIST

Patent Literature

Patent Literature 1: JP 2000-261128 A

SUMMARY OF INVENTION

Technical Problem

However, conventional silane coupling agents for use as materials that capture catalysts for electroless plating are known to have low temporal stability, such as the fact that condensation reactions proceed in response to hydrolysis with water in the atmosphere or water included in solvents due to high reactivity of alkoxysilyl groups or silylhalide groups included in molecules, thereby producing siloxane. As a result of such reactions, aggregation, suspension, and settling tend to proceed, thereby degrading deposition properties.

The present invention has been achieved in view of these circumstances, and an object of the present invention is to provide a compound which has excellent stability and adhesion to a substrate, and has an ability to provide electroless plated wiring.

Solution to Problem

The inventors have searched compounds available as materials which have excellent stable and adhesion to substrates. As a result, the inventors have found a group of compounds which can serve as alternatives to silane coupling agents, thereby achieving the present invention.

The present application encompasses multiple means for at least partially solving the problem mentioned above, and will provide an example thereof as follows.

A first aspect of the present invention for solving the problem mentioned above is a polymer compound having a constituent unit represented by the following formula (1).

[Chemical Formula 1]

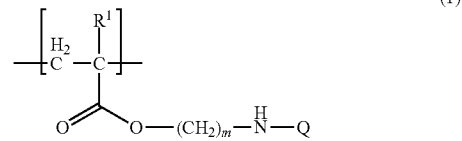

[in the formula (1), $R^1$ represents hydrogen or a methyl group, m represents an integer of 2 to 20, and Q represents a photosensitive leaving group]

A second aspect of the present invention is the polymer compound characterized in that Q is at least, one group represented by the following formula (2).

[Chemical Formula 2]

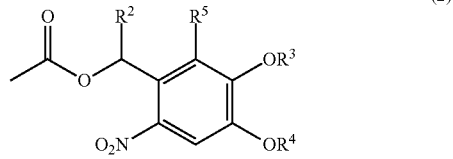

[in the formula (2) $R^2$ represents hydrogen or an alkyl group, $R^3$ and $R^4$ each independently represent an alkyl group or a fluoroalkyl group including a methyl group, and $R^5$ represents hydrogen or a nitro group]

A third aspect of the present invention is a method for manufacturing a laminated body, which includes the steps of: forming a photosensitive polymer layer by applying a surface treatment agent including the polymer compound; exposing the photosensitive polymer layer to predetermined pattern light; providing a catalyst for electroless plating on the exposed region of the photosensitive polymer layer; and bringing the photosensitive polymer layer into contact with an electroless plating solution, thereby carrying out electroless plating.

DESCRIPTION OF EMBODIMENTS

Figure 1A:
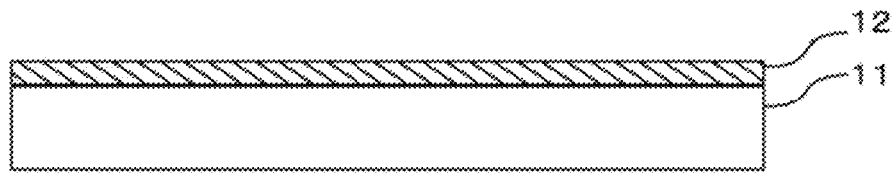
FIGS. 1(a) to 1(e) are cross-sectional views for explaining an example of a method for manufacturing a laminated body with an electroless plating pattern applied thereto.

The present invention will be described in detail below. It is to be noted that the present invention is not to be considered limited by the embodiment. In addition, in this specification, the term (meth)acrylate refers to an acrylate and/or a methacrylate.

<Polymer Compound>

A polymer compound according to the present embodiment includes at least one constituent unit represented by the following formula (1).

[Chemical Formula 3]

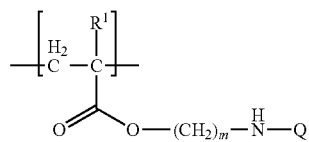

(1)

In the formula (1), $R^1$ represents hydrogen or a methyl group, and m represents an integer of 2 to 20. Above all, it is preferable to represent an integer of 2 to 16, and furthermore, it is particularly preferable to represent an integer of 2 to 8.

In the formula (1), Q represents a photosensitive leaving group. The photosensitive leaving group serves as an amine protective group present in the constituent unit, and the structure of the group itself is not considered as long as the group reacts to light to produce an amine, and has, as an attribute, no metal captured. Specifically, examples of the group can include, for example, o-nitrobenzyl group, α-methyl-nitropiperonyl group, α-methyl-nitropiperonyloxycarbonyl group, 1-pyrenylmethyloxycarbonyl group, α,α-dimethyl-3,5-dimethoxybenzyloxycarbonyl group, 4-nitropyridine N-oxide group, m-nitrophenylcarbanate group, 3,5-dimethoxybenzylcarbanate group, o-nitrobenzyloxycarbonyl group, 3,4-dimethoxy-6-nitrobenzyloxycarbonyl group, phenyl(o-nitrophenyl)methylcarbamate group, p-methoxyphenacyl group, 1,3-dithiolene group, 1,3-oxathiolene group, p-methoxybenzyl group, tosyl group, and benzenesulfonamide group.

In addition, Q is at least one group represented by the following formula (2).

[Chemical Formula 4]

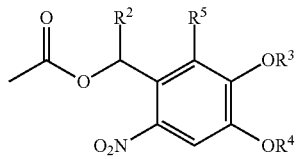

(2)

In the formula (2), $R^2$ represents hydrogen, or a linear, branched, or cyclic alkyl group having 1 to 10 carbon atoms. Examples of the alkyl group having 1 to 10 carbon atoms specifically include a methyl group, an ethyl group, an n-propyl group, an isopropyl group, an n-butyl group, a t-butyl group, and a cyclohexyl group. Among these groups, the isopropyl group, the ethyl group, and the methyl group are preferred, and the isopropyl group and the methyl group are particularly preferred.

$R^3$ and $R^4$ each independently represent a linear or branched alkyl group having 1 to 30 carbon atoms, or a linear or branched fluoroalkyl group having 1 to 30 carbon atoms. Examples of the alkyl group having 1 to 30 carbon atoms specifically include a methyl group, an ethyl group, an n-propyl group, an isopropyl group, an n-butyl group, a t-butyl group, and a decyl group, and among these groups, the linear alkyl groups are preferred, and the methyl group is particularly preferred.

Examples of the fluoroalkyl group having 1 to 30 carbon atoms specifically include trifluoromethyl group, pentafluoroethyl group, heptafluoropropyl group, 1-(trifluoromethyl)-1,2,2,2-tetrafluoroethyl group, nonafluorobutyl group, 1,1-di(trifluoromethyl)-2,2,2-trifluoroethyl group, undecafluoropentyl group, tridecafluorohexyl group, pentadecafluoroheptyl group, heptadecafluorooctyl group, heptadecafluoroundecyl group, tridecafluorononyl group, and trifluorodecyl group, and among these groups, the heptadecafluoroundecyl group and the tridecafluorononyl group are preferred, and the heptadecafluoroundecyl group is particularly preferred.

It is to be noted that $R^3$ and $R^4$ can be each independently selected, which may be identical substituents, or different substituents.

$R^5$ represents hydrogen or a nitro group.

The polymer compound represented by the formula (1) where Q is a group represented by the formula (2) is obtained by, for example, polymerization of a compound (monomer) represented by the following formula (3), and represented as in the following formula (4).

[Chemical Formula 5]

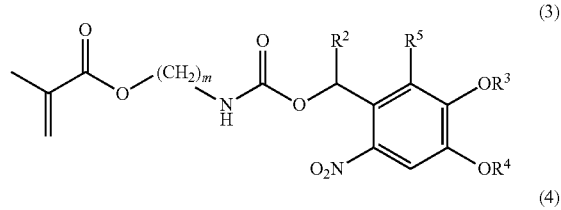

(3)

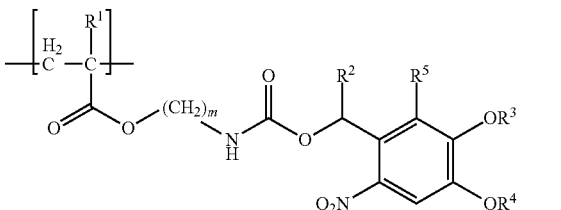

(4)

In the formulas (3) and (4), $R^1$ to $R^5$ and m express the same meanings as mentioned previously.

The polymerization of the compound represented by the formula (3) is not particularly limited, but preferably a radical polymerization method from the perspective of ease of control and the like, and in the radical polymerization, more preferably controlled radical polymerization. Controlled radical polymerization methods include a chain transfer agent method, and a living radical polymerization method that is a type of living polymerization, and the living radical polymerization is further preferred which easily controls molecular weight distributions. Further, living radical polymerization methods include a nitroxy radical polymerization method (NMP), an atom transfer radical polymerization method (ATRP), and a reversible addition-fragmentation chain transfer polymerization method (RAFT), and from the perspective of temperature and versatility, the atom transfer radical polymerization method (ATRP) is particularly desirable.

It is to be noted that conventionally known polymerization initiators can be used appropriately in the case of using radical polymerization. In addition, radical polymerization initiators may be used singly, or two or more thereof may be used, and commercially available radical polymerization initiators may be used as they are.

For example, azo polymerization initiators can be used which are compounds that have azo groups (—N═N—) and produce radicals along with $N_2$. Specifically, the initiators include azonitroles, azoesters, azoamides, azoamidines, and azoimidazolines. Further specifically, the initiators include, for example, 2,2'-azobis(2-amidinopropane)dihydrochloride, 4,4'-azobis(4-cyanovaleric acid), 2,2'-bis(2-imidazoline-2-yl)-2,2'-azopropane dihydrochloride, 2,2'-bis(2-imidazoline-2-yl)-2,2'-azopropane, 2,2'-azobis[N-(2-hydroxyethyl)-2-methylpropioneamide], 2,2'-azobisisobutyronitrile (AIBN), and 2,2'-azobis(2,4-dimethylvaleronitrile) (ADBN). Among these compounds, 2,2'-azobisisobutyronitrile (AIBN) and 2,2'-azobis(2,4-dimethylvaleronitrile) (ADBN) are preferred, and 2,2'-azobisisobutyronitrile (AIBN) is particularly preferred.

In particular, as a polymerization initiator in the case of using living radical polymerization, for example, as a polymerization initiator for an atom transfer radical polymerization method (ATRP), conventionally known initiators can be used appropriately. Specifically, the initiators include, for example, organic halogen compounds such as 1-phenylethylchloride, 1-phenylethylbromide, chloroform, carbon tetrachloride, 2-bromopropionitrile, 2-chloropropionic acid and derivatives thereof, 2-bromopropionic acid and derivatives thereof, 2-chloroisobutyric acid and derivatives thereof, and 2-bromoisobutyric acid and derivatives thereof. Among these initiators, the 2-bromopropionic acid and derivatives thereof are preferred, and allyl 2-bromo-2-methylpropionate and N-[3-(trimethyoxysilyl)propyl]-2-bromo-2-methylpropioneamide are particularly preferred.

Further, other additives can be also used appropriately. For example, for a catalyst for use in the polymerization reaction, conventionally known catalysts can be used appropriately depending on the polymerization method. For example, as a catalyst for use in an atom transfer radical polymerization method (ATRP), a metal catalyst can be used containing, for example, a metal such as Cu, Fe, and Ru. In particular, zerovalent copper, and monovalent copper compounds including $Cu^+$ are preferred. Specifically, examples of the catalyst include, for example, Cu(0), CuCl, CuBr, and $Cu_2O$. With the use of a divalent metal catalyst which is excellent in stability, for example, AIBN, an ascorbic acid, or the like may be used to reduce the catalyst to a monovalent metal catalyst in a reaction solution.

In addition, ligands can be also used appropriately depending on the metal catalyst. The ligands include, for example, 2,2'-bipyridine and derivatives thereof, 1,10-phenanthroline and derivatives thereof, tetramethylethylenediamine, pentamethyldiethylenetriamine, tris(dimethylaminoethyl)amine (Me6TREN), triphenylphosphine, and tributylphosphine.

Furthermore, other common additives can be also added for providing properties such as adhesion, coating uniformity, chemical resistance, and heat resistance.

The number average molecular weight of the thus synthesized polymer compound having a constituent unit represented by the formula (4) is, from the perspective of reducing the risk of dissolving/peeling into a plating bath or the like, and securing solubility, preferably 500 or more and 10000 or less such that wet deposition can be achieved, more preferably 800 or more and 6000 or less, and further preferably 1000 or more and 5000 or less. For the same reason, the molecular weight distribution preferably has a peak in the range of 1000 to 6000, more preferably in the range of 1000 to 5000. These can be measured by gel permeation chromatography (GPC).

It is to be noted that the polymer compound may be a mixture including two or more (meth)acrylate compounds including at least one constituent unit represented by the formula (4). In addition, the polymer compound may be a copolymer including any one, or two or more other constituent units, other than those represented by the formula (4).

The compound (monomer) represented by the formula (3) is obtained by urethanization reaction between a compound represented by the following formula (5) and a compound represented by the following formula (6).

[Chemical Formula 6]

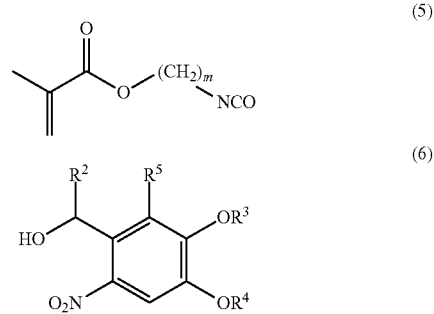

In the formulas (5) and (6), $R^1$ to $R^5$ and m express the same meanings as mentioned previously.

Compounds represented by the formula (5) include, for example, 2-isocyanatoethyl methacrylate, 3-isocyanatopropyl methacrylate, 4-isocyanatobutyl methacrylate, and 5-isocyanatopentyl methacrylate. Among the foregoing compounds, 2-isocyanatoethyl methacrylate is preferred.

Compounds represented by the formula (6) include, for example, 4,5-dimethoxy-2-nitrobenzylalcohol, 4,5-diethoxy-2-nitrobenzylalcohol, 4,5-dipropoxy-2-nitrobenzylalcohol, 3,4-dimethoxy-2,6-dinitrobenzylalcohol, 3,4-diethoxy-2,6-dinitrobenzylalcohol, 3,4-dipropoxy-2,6-dinitrobenzylalcohol, 1-(4,5-dimethoxy-2-nitrophenyl)ethanol, 1-(4,5-diethoxy-2-nitrophenyl)ethanol, 1-(4,5-dipropoxy-2-nitrophenyl)ethanol, 1-(4,5-dimethoxy-2-nitrophenyl)propanol, 1-(4,5-diethoxy-2-nitrophenyl)propanol, 1-(4,5-dipropoxy-2-nitrophenyl)propanol, 1-(4,5-dimethoxy-2-nitrophenyl)butanol, 1-(4,5-diethoxy-2-nitrophenyl)butanol, 1-(4,5-dipropoxy-2-nitrophenyl)butanol, 1-(3,4-dimethoxy-2,6-dinitrophenyl)ethanol, 1-(3,4-diethoxy-2,6-dinitrophenyl)ethanol, 1-(3,4-dipropoxy-2, 5-dinitrophenyl)ethanol, 1-(3,4-dimethoxy-2,6-dinitrophenyl)propanol, 1-(3,4-diethoxy-2,6-dinitrophenyl)propanol, 1-(3,4-dipropoxy-2,6-dinitrophenyl)propanol, 1-(3,4-dimethoxy-2,6-dinitrophenyl)butanol, 1-(3,4-diethoxy-2,6-dinitrophenyl)butanol, 1-(3,4-dipropoxy-2,6-dinitrophenyl)butanol. Among the foregoing compounds, 4,5-dimethoxy-2-nitrobenzyl alcohol is preferred.

In this reaction, the volume ratio of the compound represented by the formula (6) to the compound represented by the formula (5) is 0.2 to 5, more preferably 0.5 to 1 in molar ratio.

In the urethanization reaction between the compound represented by the formula (5) and the compound represented by the formula (6), urethanization reaction catalysts may be used from the perspective of reducing the reaction time.

The urethanization reaction catalysts include, for example, tertiary amine compounds such as N-methylmorpholine, N-ethylmorpholine, dimorpholinomethane, ethyl morpholinoacetate, N-(3-dimethylaminopropyl)morpholine, N-methylpiperidine, quinoline, 1,2-dimethylimidazole, N-meythyldicyclohexylamine, triethylamine, pyridine, 1,4-diazabicyclooctane, tetramethyl-1,3-butanediamine, tetramethyl-1,3-propanediamine, dimethyldiethyl-1,3-propanediamine, pentamethyldiethylenediamine, tetraethylmethanediamine, bis(2-dimethylaminoethyl)adipate, bis(2-diethylaminoethyl)adipate, dimethylcyclohexylamine, diethylcyclohexylamine, methyloctylcyclohexylamine, and methyldodecylcyclohexylamine; and tin-containing compound such as tin chloride, tetra-N-butyltin, tetraphenyltin, tri-n-butyltin acetate, dimethyl dichloro tin, di-n-butyltin diacetate, di-n-butyl dichlorotin, di-n-butyltin dilaurate (DBTDL), mercaptide di-n-butyltin dilaurate, bis(2-ethylhexyl)tin oxide, and di-n-butyltin sulfide. Among the foregoing catalysts, di-n-butyltin dilaurate (DBTDL) is preferred.

The amount of urethanization reaction catalyst used is 0.01 to 1 parts by mass, more preferably 0.01 to 0.1 parts by mass with respect to 100 parts by mass of the compound represented by the formula (5).

It is possible to cause this reaction to proceed even in the absence of any solvent, but it is also possible to develop the reaction in the presence of a solvent. The solvent is desirably a solvent that is not reactive with the compound, and examples of the solvent include, for example, acetone, tetrahydrofuran, acetonitrile, chloroform, dichloromethane, benzene, toluene, hexane, and pyridine. Above the foregoing solvents, tetrahydrofuran is preferred.

It is possible to adjust the reaction temperature for this reaction appropriately depending on the temperature of the solvent mentioned above and the like, and from the perspective of the reaction time and the inhibition of side reactions, the reaction temperature desirably falls within the range of 0 to 100° C., preferably 30 to 80° C.

This urethanization can provide a precursor for a (meth) acrylate compound containing an urethane linkage represented by the formula (3). From the compound (3) obtained, a (meth) acrylate compound represented by the formula (4) can be obtained by the polymerization method mentioned above. The foregoing polymer compound can be prepared, for example, in the following way.

<Surface Treatment Agent>

The polymer compound including at least one constituent unit represented by the formula (4) can be, for example, dissolved in a common organic solvent, and thereby used as a surface treatment agent preferred in electroless plating. The organic solvent can be selected appropriately depending on conditions such as volatilization temperature and tolerant of pollution, and examples of the solvent include, for example, methanol, ethanol, propanol, isopropanol, butanol, chlorobenzene, dichloromethane, chloroform, tetrachloroethane, acetonitrile, benzene, toluene, o-dichlorobenzene, tetrahydrofuran, methyl isobutyl ketone, 1,4-dioxane, cyclohexanone, methyl isobutyl ketone, methyl ethyl ketone, dimethylformamide, dimethylacetamide, acetone, hexane, and ethyl acetate. One of these solvents may be used singly, or two or more thereof may be used in combination.

<Pattern Formation by Electroless Plating>

With the surface treatment agent according to the present embodiment, an electroless plating pattern can be formed by the following method, for example. FIGS. 1(a) to 1(e) are cross-sectional views for explaining an example of a method for manufacturing a laminated body with an electroless plating pattern according to the present embodiment applied thereto.

(First Step)

First, as shown in FIG. 1(a), the surface treatment agent containing the polymer compound including at least one constituent unit represented by the formula (4) is applied onto the surface of a substrate 11, thereby depositing a photosensitive polymer layer 12.

It is to be noted that the substrate 11 may be any of common substrate materials such as organic materials, inorganic materials, and mixture materials of inorganic materials and organic materials. Specifically, materials used for the substrate 11 include organic materials typified by: polyesters such as polyethylene terephthalate (PET), polybutylene naphthalate (PBT), and wholly aromatic polyester; polyolefins such as polyethylene (PE), polypropylene (PP), polystyrene, cyclo olefin polymer (COP), and EVA; vinyl resins such as polyvinyl chloride and polyvinylidene chloride, and others, flexible plastic substrates such as poly ether ether ketone (PEEK), polysulfone (PSF), polyethersulfone (PES), polycarbonate (PC), polyamide, polyimide, acrylic resins, triacetyl cellulose (TAC), and inorganic materials typified by glass, ceramics, silicon nitrides, quarts, silicon wafers, and metals. Furthermore, a substrate may be adopted which has a cross-linked structure such as thermosetting resin, photo-curable resin, or the like formed on a release film.

As a method for the application, any of common deposition techniques may be used, such as physical vapor deposition methods (PVD), chemical vapor deposition methods (CVD), and liquid phase growth. Among the foregoing methods, in particular, liquid-phase growth methods are preferred, which include, for example, coating methods (spin coating, dip coating, die coating, spray coating, roll coating, brush coating) and printing methods (flexographic printing, screen printing). In addition, SAM films and LB films may be employed.

Further, for example, a treatment of drying a solvent by heat, pressure reduction, or the like may be added to the present step.

(Second Step)

Figure 1B:
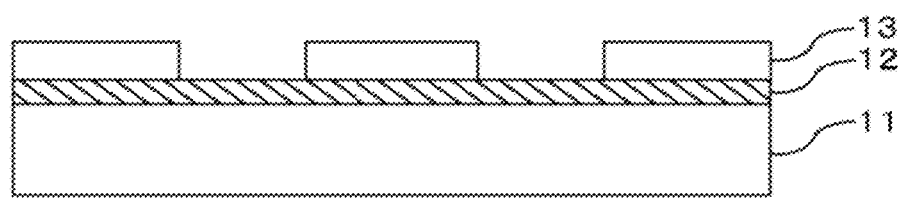

Next, as shown in FIG. 1(b), a photomask 13 is formed which has an exposure region in a predetermined pattern. The exposure method is not limited to means with the use of a photomask, but means can be used such as projection exposure with the use of an optical system such as a lens and a mirror, and maskless exposure with the use of a spatial light modulation element, a laser beam, or the like.

(Third Step)

Figure 1C:
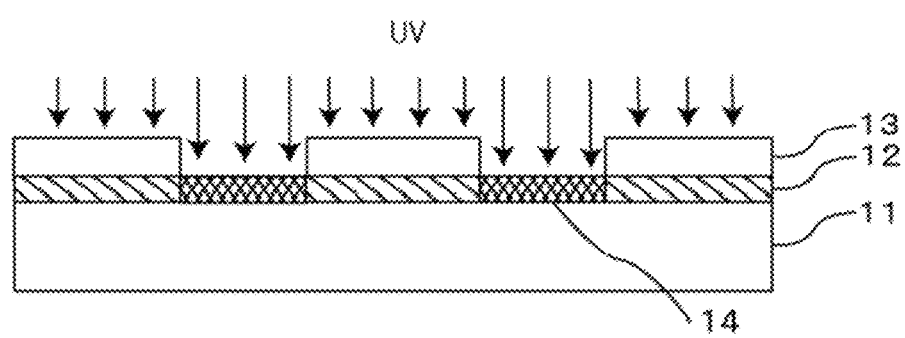

Thereafter, as shown in FIG. 1(c), the surface is entirely irradiated with ultraviolet light. Thus, the photosensitive polymer layer 12 is exposed to the light in the exposure region of the photomask 13, thereby forming an amine generation layer 14.

Figure 2:
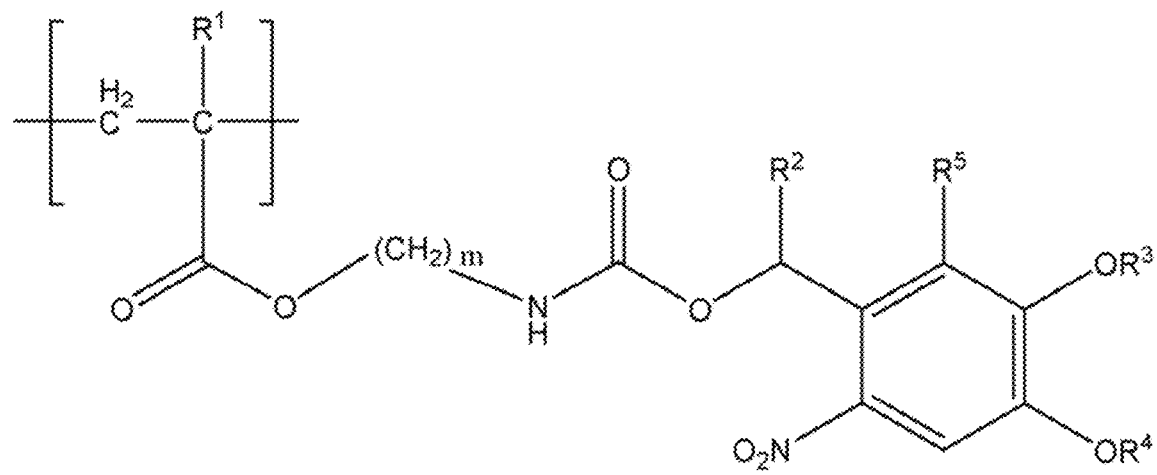
FIG. 2 is an explanatory diagram of a photoreaction mechanism in exposure of a photosensitive polymer layer 12 to light.
Figure 2:
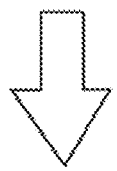
Figure 2:
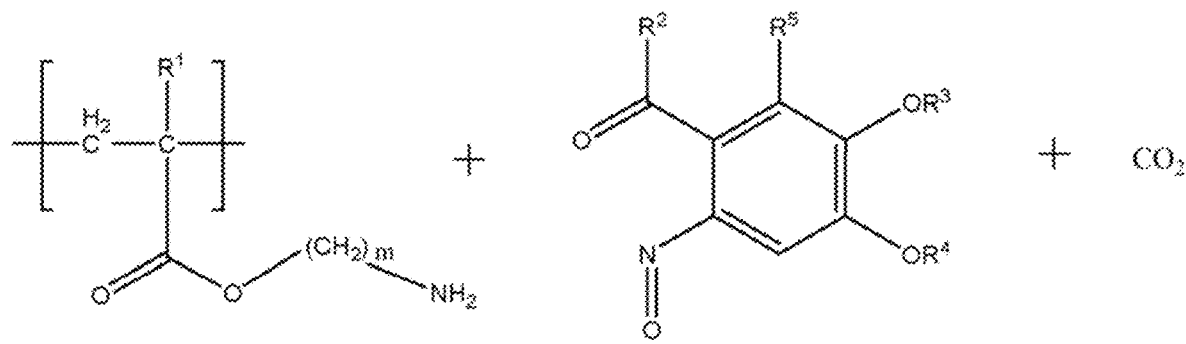

FIG. 2 is an explanatory diagram of a photoreaction mechanism in the exposure of the photosensitive polymer layer 12 to the light. On the exposure to the ultraviolet light, the polymer compound included in the photosensitive polymer layer 12 undergoes, with decarboxylation, induced deprotection of a photosensitive leaving group, thereby exposing an amino group. On the other hand, no deprotection proceeds in the masked non-exposure region, thus keeping the photosensitive leaving group as it is, and forming no amine generation layer 14. This mechanism makes it possible to form the amine generation layer 14 in a regioselective manner.

It is to be noted that the layer can be irradiated, depending on the structure of the photosensitive group, with ultraviolet light of a wavelength such that an optimum quantum efficiency is achieved. Examples of the light include, for example, an i-ray of 365 nm. In addition, the exposure amount and the exposure time may be adapted to generate some amine, while there is no need for deprotection to proceed always completely. In that regard, conditions (such as the activity of a plating bath) can be modified appropriately depending on how deprotection proceeds in a plating step to be described.

(Fourth Step)

Figure 1D:
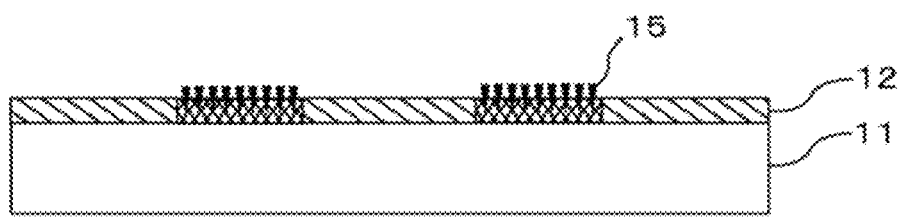

Next, as shown in FIG. 1(d), a catalyst is provided on the surface.

Specifically, in this step, a catalyst layer 15 is formed only on the amine generation layer 14, because it is possible for only the amine generation layer 14 including a primary amine to capture and reduce the catalytic material. It is to be noted that as a catalyzing method, any method may be used, such as a catalyst-accelerator method and an activating method. In addition, any catalytic material may be also used as long as the material is capable of supporting the amine.

(Fifth Step)

Figure 1E:
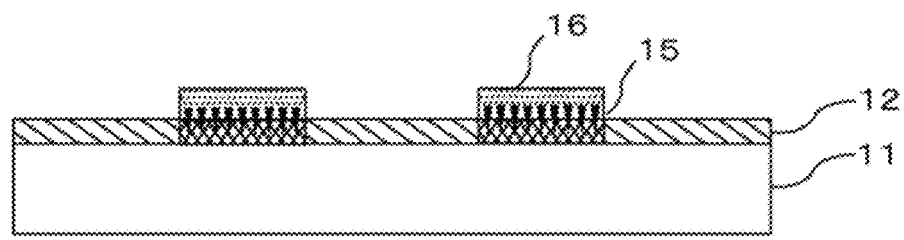

Finally, as shown in FIG. 1(e), an electroless plating treatment is carried out to form a plating film 16.

Specifically, in this step, the substrate 11 is immersed in an electroless plating bath to reduce metal ions on the catalyst surface, thereby depositing the plating film 16. In that regard, the plating film 16 can be selectively deposited only on the amine generation layer 14, because the catalyst layer 15 which supports an adequate amount of catalyst is formed on the surface of the amine generation layer 14. When the reduction is insufficient, the substrate may be immersed in a solution of a reductant such as sodium hypophosphite and sodium borohydride, to reduce metal ions on the amine in a proactive manner.

According to the method as mentioned above, a simple step only with a photomask can be adopted, without the need to provide a chemical resist or the like separately in the ultraviolet exposure step. Accordingly, there is naturally no need for any step of removing a resist layer. In addition, the catalytic reduction ability of the amine also makes it possible to skip a commonly required step of catalyst activation treatment, thereby allowing for highly fine patterning while achieving significant reductions in cost and time.

In addition, the plating bath in the plating treatment step typically has hot water, and it is known that the film is dissolved into the plating bath is known in the case of using no silane coupling agent. However, in the case of the polymer compound according to the present embodiment, the higher molecular weight improves the adhesion and controls the solubility, thereby allowing for patterning without dissolving the film into the plating bath.

Furthermore, the polymer compound can be deposited with heat on the order of the volatilization temperature (approximately 60° C. in the case of chloroform) of the solvent, and thus subjected to patterning in a low-temperature process, without damaging a PET substrate or the like. In addition, because dip coating methods can be used, the polymer compound can be thus utilized even in R2R steps in an extremely compatible manner.

Additionally, the polymer compound according to the present embodiment has a non-reactive molecular structure that has water resistance, acid resistance, and alkali resistance required in the plating step, and thus has atmospheric stability and chemical stability, as compared with conventional silane coupling agents and the like. Therefore, the surface treatment agent for use at the time of deposition is stable over a long period of time, without causing problems such as changes in concentration due to more difficult solubility, insolubilization, settling, or the like at the time of conveyance, storage, or treatment. Therefore, the surface treatment agent can be used as it is for the application step, without preliminary preparations such as filtration and concentration adjustment.

In addition, even in the case of exposure to an acid solution or hot water for use in the plating step, or others, for example, an alkaline solution or the like, strong adhesion of the polymer to the substrate is kept without causing any decomposition/peeling. Furthermore, even as compared with a case of using a poorly water-soluble photo-amine generation agent without any alkoxysilane as it remains to have a low molecular weight, there is no dissolving/peeling caused in the plating step, with high plating resistance.

In addition, the polymer compound represented by the formula (4) according to the present embodiment can be used, not only for the formation of plating patterns, but also for the manufacture of conductive materials, polymer films, other devices such as transistors. It is to be noted that the structures of the transistors are not particularly limited, but can be selected appropriately for any purpose.

Figure 7A:
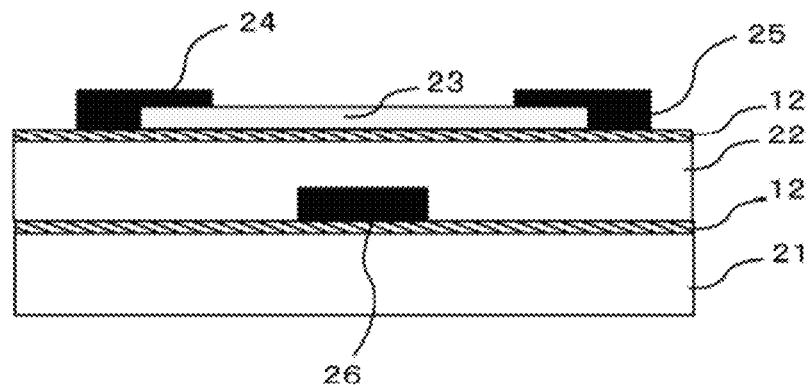
FIGS. 7(a) to 7(d) are transistors that use photosensitive polymer layers 12.
Figure 7B:
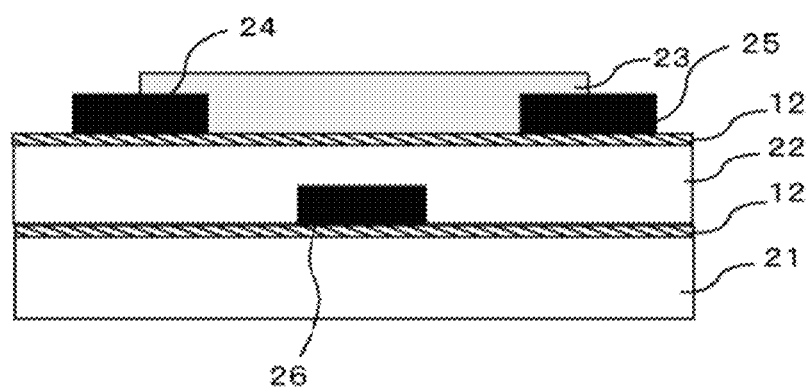
Figure 7C:
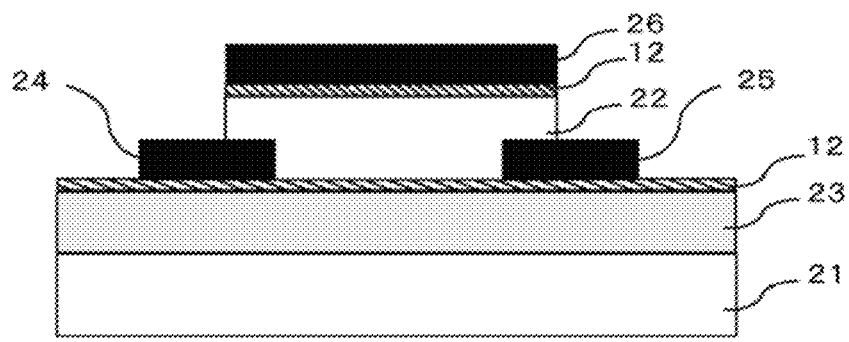
Figure 7D:
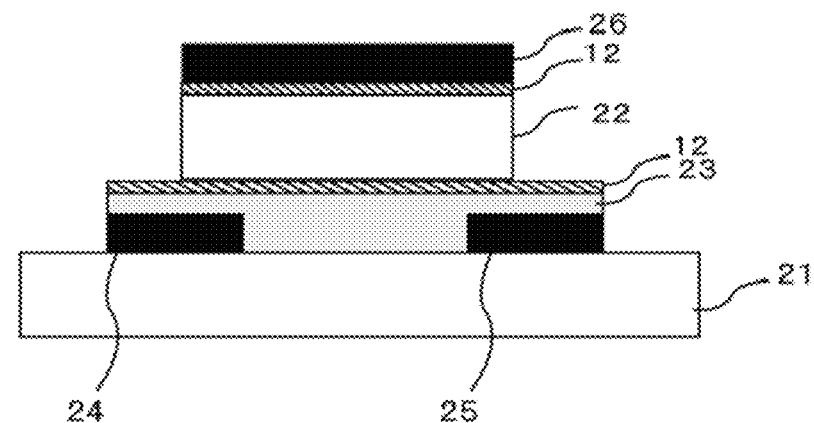

FIGS. 7(a) to 7(c) show examples of transistors manufactured with the use of the polymer compound according to the present embodiment. FIGS. 7(a), 7(b), 7(c), and 7(d) respectively show examples of a top-contact/bottom-gate type, a bottom-contact/bottom-gate type, a top-contact/top-gate type, and a bottom-contact/top-gate type. In the figured, a layer 21, a layer 22, a layer 23, a layer 24, a layer 25, and a layer 26 respectively represent a base material, a gate insulating layer, a semiconductor layer, a source electrode, a drain electrode, and a gate electrode, and a layer 12 serves as a photosensitive polymer layer 12 that uses a polymer compound represented by the formula (4) according to the present embodiment. As shown, the deposition of the photosensitive polymer layers 12 with the use of the polymer compound according to the present embodiment for the formation of respective electrodes for transistors and metal wirings makes it possible to form highly fine and conductive electrodes and fine wirings in a regioselective manner.

EXAMPLES

The present invention will be more specifically described below with reference to examples and comparative examples. However, the present invention is not to be considered limited by the examples.

Example 1: Synthesis of Photosensitive Amine Generation Monomer

By the method mentioned below, 2-((((4,5-dimethoxy-2-nitrobenzyl)oxy)carbonyl)amino)ethylmethacrylate (NBC-AEMA) represented by the following formula (7) was synthesized.

Into a three-necked round-bottom flask with a septum and a three-way cock connected thereto, 7.98 g (37.47 mmol) of 4,5-dimethoxy-2-nitrobenzyl alcohol (Sigma Aldrich, Product Number: 392847) was put by weighing, and subjected to nitrogen substitution. 100 ml of anhydrous THF (Sigma Aldrich, Product number: 401757), 0.10 g (6.63 mmol) of dibutyltin laurate (Tokyo Chemical Industry Co., Ltd., Product Number: D0303), and 6.97 g (44.96 mmol) of methacrylic acid 2-isocyanatoethyl (Tokyo Chemical Industry Co., Ltd., Product Number: 10748) were put therein by weighing, and stirred for approximately 10 minutes. After reflux at 80° C. for 2 hours, a rotary evaporator and a vacuum pump were used for drying under reduced pressure, thereby providing a crude product of 18.974 g. Thereafter, the crude product was dissolved in 50 ml of ethyl acetate (Wako Pure Chemical Industries, Ltd., Product Number: 051-00351) in a recovery flask, and with the addition of 100 ml of hexane (Wako Pure Chemical Industries, Ltd., Product Number: 085-00411) thereto, purified through solid precipitation by a poor solvent addition method. The precipitated solid was subjected to filtration with the use of a filter of 10 um, and to drying under reduced pressure through a vacuum pump, thereby providing a pale yellow powder 13.33 g (36.21 mmol, yield: 97%) as a compound represented by the following formula (7).

Here are measurement results of $^1$H-NMR (Bruker Bio-Spin K.K., AVANCEIII HD 500 MHz) and ESI-MS (Shimadsu Corporation, LCMS2020).

$^1$H-NMR (500 MHz, CDCl$_3$): δ1.94 (3H, s), 3.55 (2H, d), 3.95 and 3.97 (3H, s), 4.26 (2H, d), 5.59 (1H, s), 5.89 (1H, br), 6.11 (1H, s), 7.00 (1H, s), 7.70 (1H, s)

ESI-MS: C$_{16}$H$_{21}$N$_2$O$_8^+$ (M+H$^+$) Calculation Value m/z=369, Actual Measurement Value m/z=369

[Chemical Formula 7]

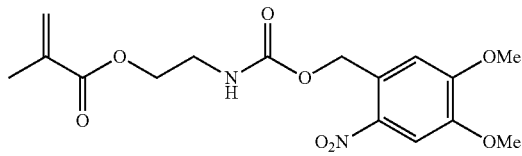

(7)

Example 2: Synthesis of Photosensitive Polymer

By the method mentioned below, poly2-((((4,5-dimethoxy-2-nitrobenzyl)oxy)carbonyl)amino)ethylmethacrylate (P-NBC-AEMA) represented by the following formula (8) was synthesized.

Figure 3:
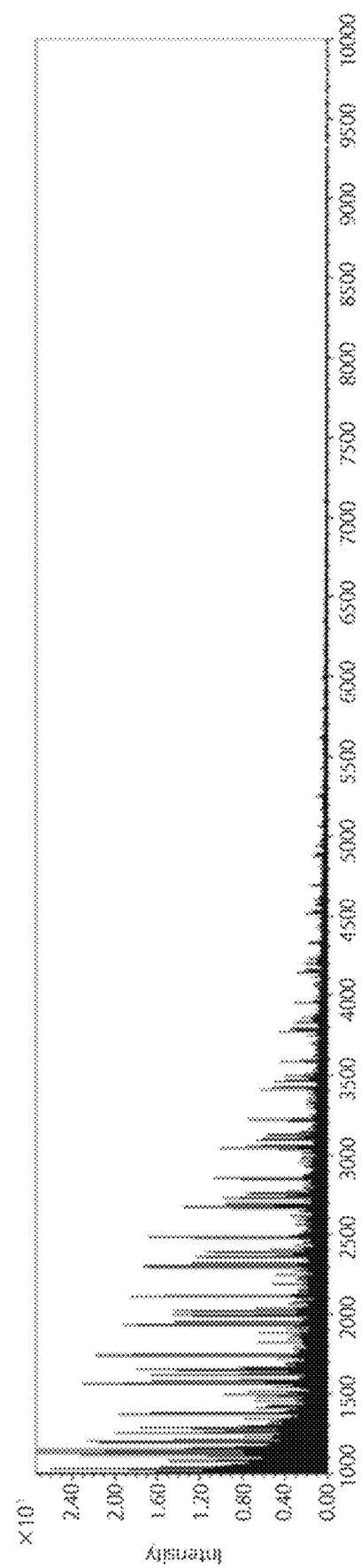
FIG. 3(a) is a chart of a measurement result in MALDI-TOF-MS.
FIG. 3(b) is a chart of a measurement result in MALDI-TOF-MS.
FIG. 3(c) is a chart of a measurement result in MALDI-TOF-MS.
Figure 3:
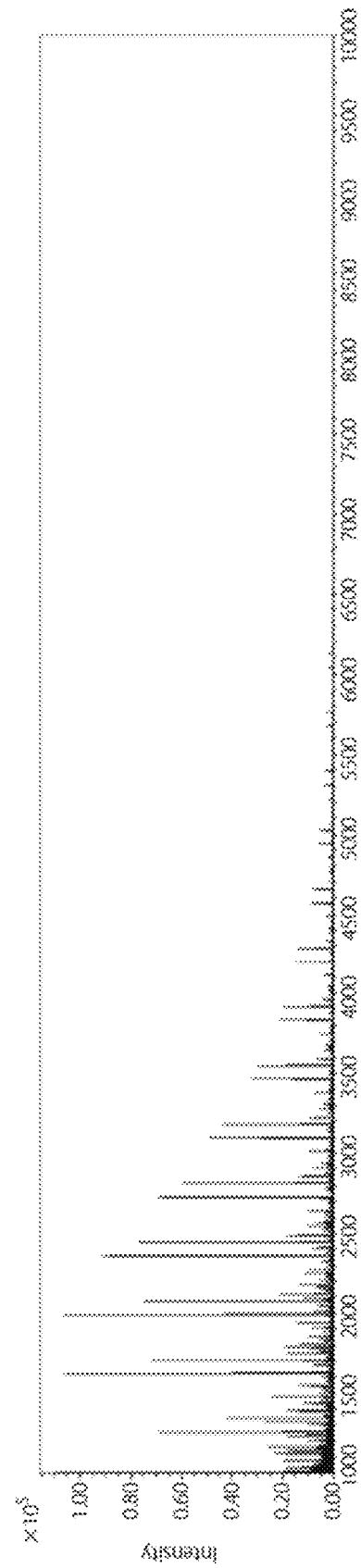
Figure 3:
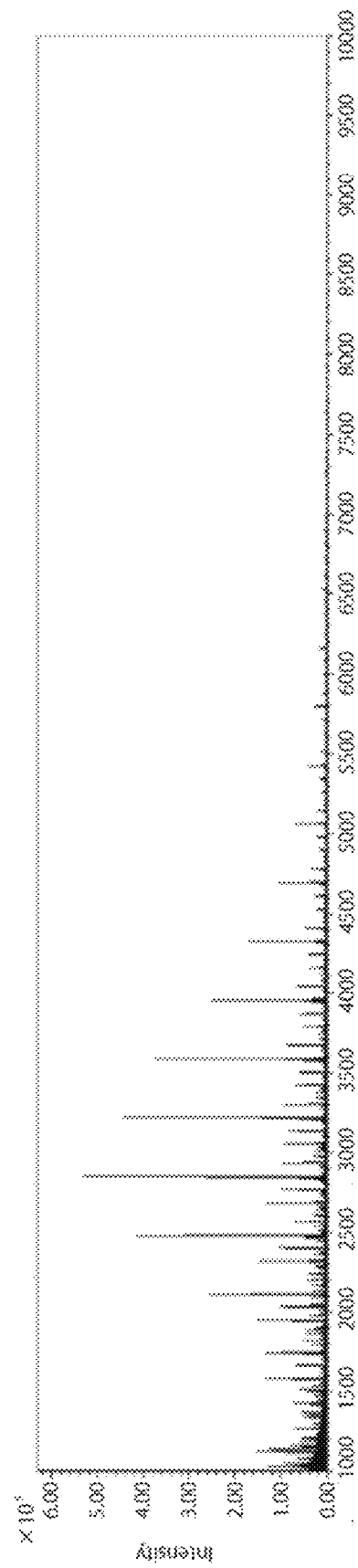

Into a three-necked Hertz flask with a septum and a three-way cock connected thereto, 4.00 g (10.90 mmol) of the 2-((((4,5-dimethoxy-2-nitrobenzyl)oxy)carbonyl)amino)ethylmethacrylate synthesized in Example 1 and 178.92 mg (1.09 mmol) of 2,2′-azobis(isobutyronitrile) (Tokyo Chemical Industry Co., Ltd., Product Number: A0566) were put by weighing. After nitrogen substitution, with the addition of 5.5 ml of degassed anhydrous DMF (Sigma Aldrich, Product Number: 227056) thereto, degassing treatment was carried out by ultrasound irradiation under reduced pressure with the use of a vacuum, pump. After heating and stirring for 70 hours at 80° C., the mixture was allowed to cool to room temperature. Into a glass tube, 120 ml, of methanol (Wako Pure: Chemical Industries, Ltd., Product Number: 137-01823) was put, and while vigorously stirring the methanol with a stirring bar, the reaction solution was delivered by drops thereto. After stirring for 30 minutes, the precipitate was allowed to settle out, the supernatant liquid was removed, and drying under reduced pressure was then carried out. The obtained precipitate was purified by a reprecipitation method with the use of 12 ml of chloroform (Wako Pure Chemical Industries, Ltd., Product Number; 038-02606) as a good solvent and a decuple volume of 120 ml methanol as a poor solvent. The purification was repeated three times, thereby providing a pale yellow solid 3.27 g (yield: 82%) as a polymer compound represented by the following formula (8). The analysis has confirmed a number average molecular weight (Mn) of 3893.5, obtained as a decamer. FIG. 3(a) shows therein a chart of a measurement result in MALDI-TOF-MS.

Here are measurement results of $^1$H-NMR (Bruker Bio-Spin K.K., AVANCEIII HD 500 MHz) and MALDI-TOF-MS (JEOL Ltd., JMS-S3000).

$^1$H-NMR (500 MHz, CDCl$_3$): δ0.85-1.55 (m), 1.85 (2H, m), 3.45 (2H, m), 3.92 (6H, m), 4.03 (2H, m), 5.42 (2H, m), 6.09 (1H, m), 6.98 (1H, m), 7.59 (1H, m),

TOF-MS: (C$_{16}$H$_{20}$N$_2$O$_8$)$_5$+C$_4$H$_6$N+C$_{16}$H$_{19}$O$_8$+Na$^+$ (M+Na$^+$) Calculation Value m/s=1930.6, Actual Measurement Value m/z=1930.6

[Chemical Formula 8]

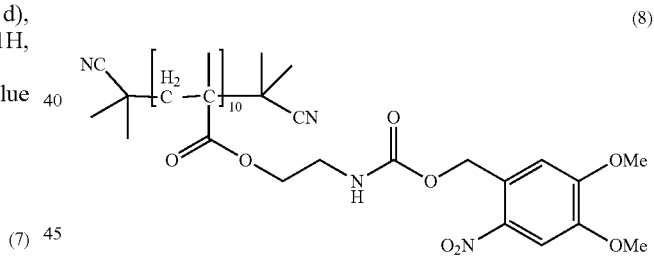

(8)

Example 3: Synthesis of Allyl Ester-Terminated Photosensitive Polymer

By the method mentioned below, allyl ester-terminated poly2-((((4,5-dimethoxy-2-nitrobenzyl)oxy)carbonyl)amino)ethylmethacrylate (P-NBC-AEMA-Allyl) represented by the following formula (9) was synthesized.

Into a two-necked Hertz flask with a septum and a three-way cock connected thereto, 58.5 mg (0.41 mmol) of copper bromide (I) (Sigma Aldrich, Product Number: 254185) was put by weighing. After nitrogen substitution, with the addition of 0.5 ml of degassed anhydrous DMF (Sigma Aldrich, Product Number: 227056) and 109.2 ul (0.41 mmol) of tris[2-(dimethylamino)ethyl]amine (Sigma Aldrich, Product Number: 723142) thereto, degassing treatment was carried out for complete dissolution by ultrasound irradiation under reduced pressure with the use of a vacuum pump. Furthermore, after stirring for 30 minutes at room temperature, 1.5 g (4.09 mmol) of 2-((((4,5-dimethoxy-2- nitrobenzyl)oxy)carbonyl)amino)ethylmethacrylate synthesized in Example 1 and 1 ml of degassed anhydrous DMF were put therein by weighing. Then, 84.6 mg (0.41 mmol) of allyl 2-bromo-2-methylpropionate was dissolved in 0.5 ml of anhydrous DMF, delivered by drops into the reactor, and stirred for 65 hours at room temperature. Into a glass tube, 80 ml of methanol (Wako Pure Chemical Industries, Ltd., Product Number: 137-01823) was put, and while vigorously stirring the methanol with a stirring bar, the reaction solution was delivered by drops thereto. After stirring for 10 minutes, the precipitate was allowed to settle out, the supernatant liquid was removed, and drying under reduced pressure was then carried out. The obtained precipitate was purified by a reprecipitation method with the use of 3 ml of DMF as a good solvent and 80 ml of methanol as a poor solvent. The obtained precipitate was further purified twice by a reprecipitation method with the use of 10 ml of chloroform (Wako Pure Chemical Industries, Ltd., Product Number: 038-02606) as a good solvent and a decuple volume of 100 ml methanol as a poor solvent, thereby a pale yellow solid 1.04 g (yield: 63%) as a polymer compound represented by the following formula (9). The analysis has confirmed a number average molecular weight (Mn) of 4635.5, obtained as a decamer. FIG. 3(b) shows therein a chart of a measurement result in MALDI-TOF-MS.

Here are measurement results of $^1$H-NMR (Bruker BioSpin K.K., AVANCEIII HD 500 MHz) and MALDI-TOF-MS (JEOL Ltd., JMS-S3000), $^1$H-NMR (500 MHz, CDCl$_3$); δ0.87-1.70 (m), 1.82 (2H, m), 3.44-3.49 (m), 3.92 (6H, m) 4.04 (2H, m), 5.42 (2H, m), 6.05 (1H, m), 6.98 (1H, m), 7.58 (2H, m)

TOF-MS: $(C_{16}H_{20}N_2O_8)_3+C_7H_{11}O_2+C_{16}H_{19}N_2O_8+Na^+$ (M+Na$^+$) Calculation Value m/z=1621.5, Actual Measurement Value m/z=1621.5

[Chemical Formula 9]

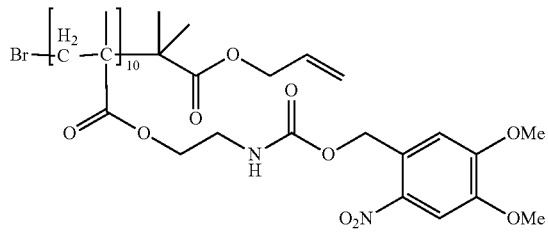

(9)

Example 4: Synthesis of Trimethoxysilyl Ethylamide-Terminated Photosensitive Polymer By the method mentioned below, trimethoxysilyl ethylamide-terminated poly2-(((((4,5-dimethoxy-2-nitrobenzyl)oxy)carbonyl)amino)ethylmethacrylate (P-NBC-AEMA-TEOS) represented by the following formula (10) was synthesized.

Into a two-necked Hertz flask with a septum and a three-way cock connected thereto, 58.5 mg (0.41 mmol) of copper bromide (I) (Sigma Aldrich, Product Number: 254185) was put by weighing. After nitrogen substitution, with the addition of 0.5 ml of degassed anhydrous DMF (Sigma Aldrich, Product Number: 227056) and 109.2 ul (0.41 mmol) of tris[2-(dimethylamino)ethyl]amine (Sigma Aldrich, Product Number: 723142) thereto, degassing treatment was carried out for complete dissolution by ultrasound irradiation under reduced pressure with the use of a vacuum pump. Furthermore, after stirring for 30 minutes at room temperature, 1.5 g (4.09 mmol) of 2-((((4,5-dimethoxy-2-nitrobenzyl)oxy)carbonyl)amino)ethylmethacrylate synthesized in Example 1 and 1 ml of degassed anhydrous DMF were put therein by weighing. 151.3 mg (0.41 mmol) of 2-bromo-2-methyl-N-(3-(trimethoxysilyl)propyl)propaneamide represented by the following formula (11) was dissolved in 0.5 ml of anhydrous DMF, delivered by drops into the reactor, and stirred for 66 hours at room temperature. Into a glass tube, 80 ml of methanol (Wako Pure Chemical Industries, Ltd., Product Number: 137-01823) was put, and while vigorously stirring the methanol with a stirring bar, the reaction solution was delivered by drops thereto. After stirring for 10 minutes, the precipitate was allowed to settle out, the supernatant liquid was removed, and drying under reduced pressure was then carried out. The obtained precipitate was purified by a reprecipitation method with the use of 3 ml of DMF as a good solvent and 80 ml of methanol as a poor solvent. The obtained precipitate was purified twice by a reprecipitation method with the use of 10 ml of chloroform (Wako Pure Chemical Industries, Ltd., Product Number: 038-02606) as a good solvent and a decuple volume of 100 ml methanol as a poor solvent, thereby a pale yellow solid 0.59 g (yield: 37%) as a polymer compound represented by the following formula (10). The analysis has confirmed a number average molecular weight (Mn) of 3767.7, obtained as a decamer. FIG. 3(c) shows therein a chart of a measurement result in MALDI-TOF-MS.

Here are measurement results of $^1$H-NMR (Bruker BioSpin K.K., AVANCEIII HD 500 MHz) and MALDI-TOF-MS (JEOL Ltd., JMS-S3000).

$^1$H-NMR (500 MHz, CDCl$_2$): δ0.87-1.82 (m), 1.88 (2H, m), 3.45-3.49 (m), 3.92 (6H, m), 4.04 (2H, m), 5.42 (2H, m), 6.10 (1H, m), 6.98 (1H, m), 7.58 (2H, m),

TOF-MS: $(C_{16}H_{20}N_2O_8)_3+C_{10}H_{22}NO_4Si+C_{16}H_{19}N_2O_8+Na^+$ (M+Na$^+$) Calculation Value m/z=1742.6, Actual Measurement Value m/z=1742.6

[Chemical Formula 10]

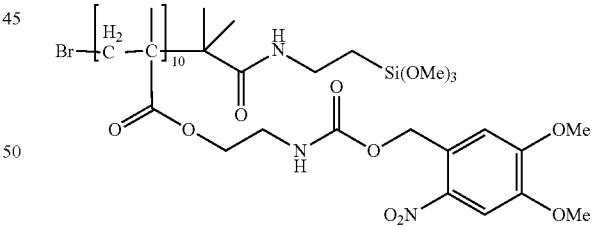

(10)

Further, 2-bromo-2-methyl-N-(3-(trimethoxysilyl)propyl)propaneamide represented by the following formula (11) used in the present example, was synthesized as follows.

Into a three-necked round-bottom flask with a septum and a three-way cook connected thereto, 0.3 g (2.7 mmol) of 4-dimethylaminopyridine (Tokyo Chemical Industry Co., Ltd., Product Number: D1450) was put by weighing. Under a nitrogen atmosphere, 100 ml of anhydrous THF (Sigma Aldrich, Product number: 401757) was put therein by weighing, and cooled to 0° C., and 6.2 g (26.9 mmol) of α-bromoisobutyrylbromide (Sigma Aldrich, Product number: 252271) and 2.7 g (26.9 mmol) of triethylamine (Wako Pure Chemical Industries, Ltd., Product number: 20-0264)

were then added thereto. Then, 3.7 g (20.7 mmol) of 3-aminopropyltrimethoxysilane (Tokyo Chemical Industry Co., Ltd., Product Number: T1255) was delivered by drops over 30 minutes with the use of a dropping funnel. After stirring for 23 hours at room temperature, filtration under reduced pressure was carried out with the use of a filter of 0.2 um, and the filtrate was subjected to drying under reduced pressure through a rotary evaporator. Thereafter, the filtrate was dissolved, in 100 ml of ethyl acetate (Wako Pure Chemical Industries, Ltd., Product Number: 051-00351), washed with 100 ml of a saturated aqueous solution of ammonium chloride and 100 ml of a saturated solution of sodium chloride, and dried with anhydrous sodium sulfate. After filtration, the filtrate was subjected to drying under reduced pressure with the use of a rotary evaporator and a vacuum pump were used, thereby providing a crude product of 5.31 g. Of the crude product, 1.86 g was purified with the use of silica gel column chromatography, thereby providing a clear and colorless liquid 1.41 g (4.3 mmol, yield: 59%) as a compound represented by the following formula (11).

Here are measurement results of $^1$H-NMR (Bruker BioSpin K.K., AVANCEIII HD 500 MHz) and ESI-MS (Shimadzu Corporation, LCMS2020).

$^1$H-NMR (500 MHz, CDCl$_3$): δ0.67 (2H, t), 1.66 (2H, m), 1.95 (6H, s), 3.27 (2H, t), 3.58 (9H, s), 6.86 (1H, br)

ESI-MS: C$_{10}$H$_{23}$BrNO$_4$Si$^+$ (M+H$^+$) Calculation Value m/z=328, Actual Measurement Value m/z=328

[Chemical Formula 11]

(11)

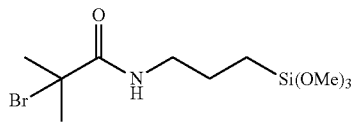

Comparative Example 1: Synthesis of Photosensitive Silane Coupling Agent

By the method mentioned below, 4,5-dimethoxy-2-nitrobenzyl(3-(trimethoxysilyl)propyl)carbamate (NBC-APTMOS) represented by the following formula (12) was synthesized.

Into a three-necked round-bottom flask with a septum and a three-way cock connected thereto, 4.00 g (14.51 mmol) of 4,5-dimethoxy-2-nitrobenzyl chloroformate (Sigma Aldrich, Product Number: 420069) was put by weighing under a nitrogen atmosphere, and dissolved by 140 ml of anhydrous THF (Sigma Aldrich, Product Number: 401757). 0.18 g (1.45 mmol) of 4-dimethylaminopyridine (Tokyo Chemical Industry Co., Ltd., Product Number: D1450) was put by weighing, and stirred for 30 minutes at room temperature. In 20 ml of anhydrous THF (Sigma Aldrich, Product Number: 401757), 5.20 g (29.03 mmol) of 3-aminopropyltrimethoxysilane (Tokyo Chemical Industry Co., Ltd., Product Number: T1255) and 2.2 g (21.77 mmol) of triethylamine (Wako Pure Chemical Industries, Ltd., Product, Number: 20-0264) were dissolved, and the solution was delivered by drops into the reaction cooled to 0° C. with the use of a dropping fennel. After stirring for 30 minutes, the temperature was increased to room temperature, and stirring was carried out for 4 hours. The reaction solution was subjected to filtration with the use of a filter of 10 um, thereby removing triethylamine hydrochloride. The filtrate was subjected to drying under reduced pressure with the use of a rotary evaporator and a vacuum pump were used, thereby providing a crude product of 8.26 g. This crude product was purified with the use of silica gel column chromatography, providing a yellow solid 5.73 g (13.68 mmol, yield: 94%) as a compound represented by the following formula 12.

Here are measurement results of $^1$H-NMR (Bruker BioSpin K.K., AVANCEIII HD 500 MHz) and ESI-MS (Shimadzu Corporation, LCMS2020).

$^1$H-NMR (500 MHz, CDCl$_3$): δ0.69 (2H, t), 1.64 (2H, tt), 3.29 (2H, t), 3.59 (9H, s), 4.03 (6H, s), 5.15 (1H, br), 5.52 (2H, s), 6.96 (1H, s), 7.78 (1H, s)

ESI-MS: C$_{16}$H$_{27}$N$_2$O$_9$Si$^+$ (M+H$^+$) Calculation Value m/z=419, Actual Measurement Value m/z=419

[Chemical Formula 12]

(12)

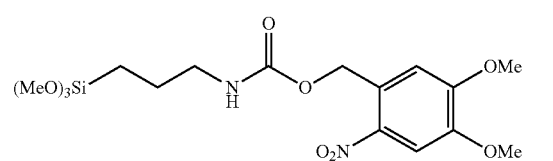

[Photosensitivity Evaluation]

The compounds represented by the formulas (7) to (10) and (12) were each evaluated for photosensitivity with the use of a UV-Vis spectrophotometer (Shimadzu Corporation, UV-2450).

Figure 4:
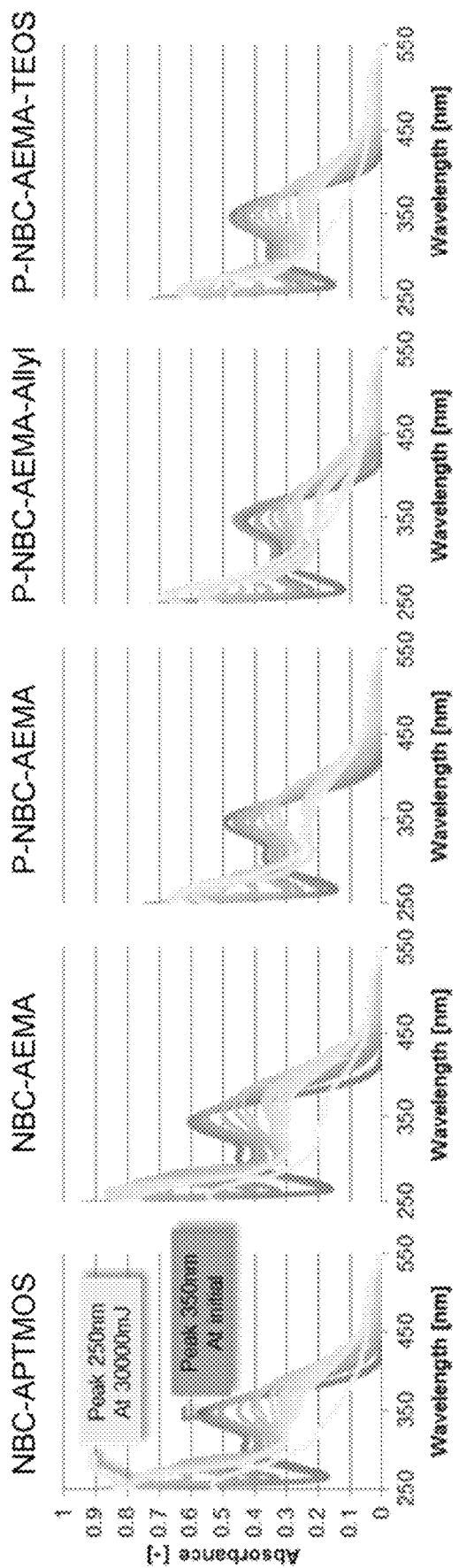
FIG. 4 is measurement results in a UV-Vis spectrophotometer.

First, the compounds represented by the formulas (7) to (10) and (12) were dissolved in chloroform or acetonitrile to create solution samples. FIG. 4 shows measurement results obtained with a UV-Vis spectrophotometer for each sample. From this result, it has been determined that the photosensitive leaving group that has absorption around 350 nm undergoes deprotection to generate an amine, and produce an aldehyde that has absorption around 250 nm at which the group is eliminated. Accordingly, it has been confirmed that both the monomer/polymers according to Examples 1 to 4 and the silane coupling agent according to Comparative Example 1 function as photosensitive amine-generating agents. In addition, the analysis of quantitative changes in reaction rate by NMR has confirmed deprotection reaction rates improved by approximately 10% in the case of irradiation at 300 mJ/cm$^2$, without any loss change in reactivity due to the increases in molecular weight.

[Preparation of Plated Wiring]

Surface treatment agents including the respective compounds represented by the formulas (7) to (10) and 12 were used for deposition onto substrates, thereby preparing plated wiring.

Example 5

Chloroform was added to the P-NBC-AEMA synthesized in Example 2, thereby making an adjustment down to 0.2 wt %. This solution was applied onto a PET substrate (Toyobo Co., Ltd., A-4100, no coating) with a spin cost (MIKASA CO., LTD., MS-A150) 3000 rpm). Thereafter, a photosensitive polymer layer is deposited by drying at 105° C. for 10 minutes.

Next, the substrate with the photosensitive polymer layer deposited over the entire surface was exposed to light with a wavelength of 365 nm at 300 mJ/cm$^2$ through a photomask (L/S=20 μm/3 mm), thereby exposing the photosensitive polymer layer to the light, and thus forming a pattern for an amine generation layer. Then, immersion in a catalyst colloid solution for electroless plating (Melplate Activator 7331 from Meltex Inc.) for 3 minutes at room temperature caused a catalyst (Pd) to adhere to the amine generation part. After washing the surface with the water, immersion in an electroless plating solution (MelplateNI-867 from Meltex Inc.) for 1 minute at 73° C. deposited nickel phosphorus on the catalyst, thereby preparing a fine plated wiring.

Example 6

The P-NBC-AEMA according to Example 5 was changed to the P-NBC-AEMA-Allyl synthesized in Example 3, and the same treatment was carried out, thereby preparing a fine plated wiring.

Example 7

The P-NBC-AEMA according to Example 5 was changed to the P-NBC-AEMA-TEOS synthesized in Example 4, and the same treatment was carried out, thereby preparing a fine plated wiring.

Comparative Example 2

The P-NBC-AEMA according to Example 5 was changed to the NBC-AEMA synthesized in Example 1, and the same treatment was carried out, thereby preparing a fine plated wiring.

Comparative Example 3

The P-NBC-AEMA according to Example 5 was changed to the NBC-APTMOS synthesized in Comparative Example 1, and the same treatment was carried out, thereby preparing a fine plated wiring.

[Evaluation of Plated Wiring and Solubility]

Figure 5A:
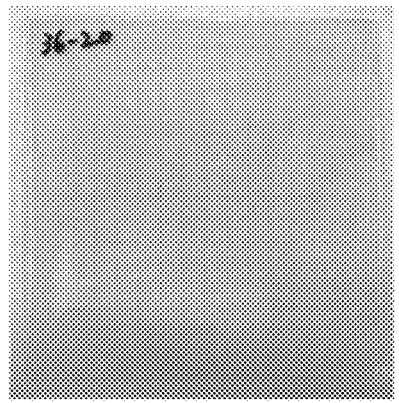
FIGS. 5(a) to 5(c) are whole photographs of PET substrates subjected to a plated wiring treatment, and optical microscope images thereof.
Figure 5A:
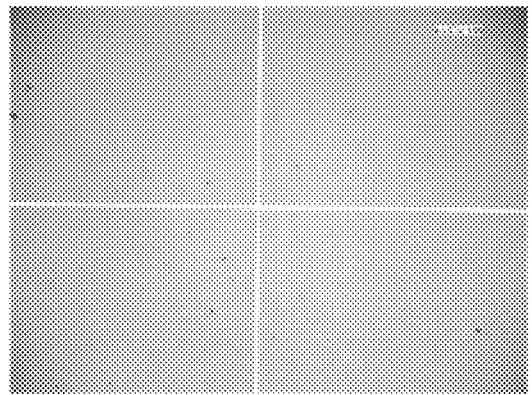
Figure 5B:
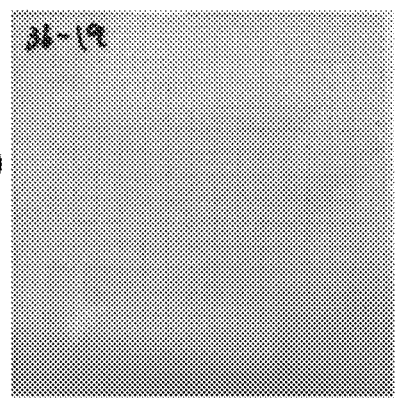
Figure 5B:
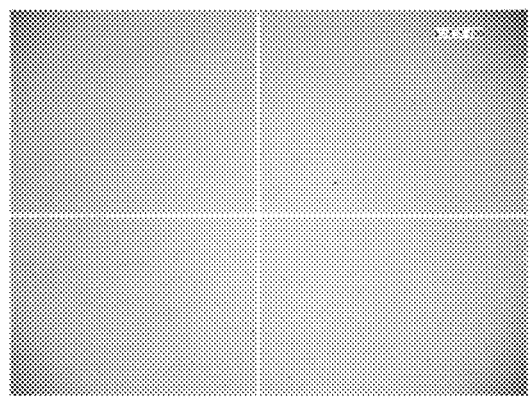
Figure 5C:
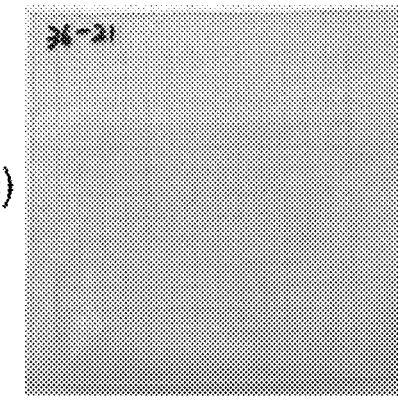
Figure 5C:
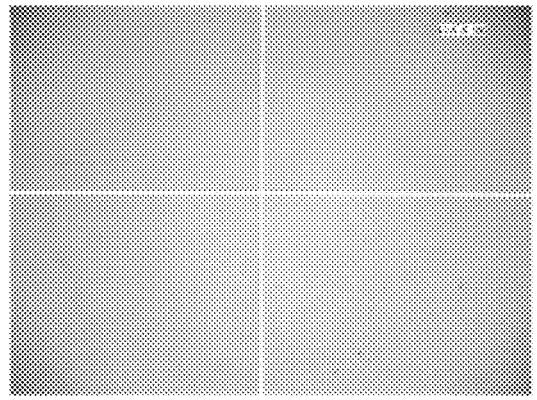

FIG. 5(a) shows a whole photograph of the PET substrate subjected to the plated wiring treatment in Example 5, and an optical microscope (VHX-900 from KEYENCE CORPORATION) image thereof. FIGS. 5(b) and 5(c) respectively show like photographs and optical microscope images of the substrates subjected to the treatments in Examples 6 and 7.

As shown, in Examples 5 to 7, it has been confirmed visually and with a microscope that favorable plated wirings with high meticulous fineness are formed without using any resist even in accordance with the low-temperature processes at 105° C. or lower. In addition, the respective layers were not found to be peeled or dissolved at all. Furthermore, the respective compounds were readily soluble in the solvents, and the solubility was not found to be changed with time.

Figure 6A:
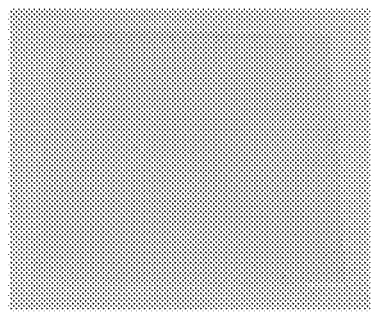
FIGS. 6(a) and 6(b) are whole photographs of PET substrates subjected to a plated wiring treatment, and optical microscope images thereof.
Figure 6A:
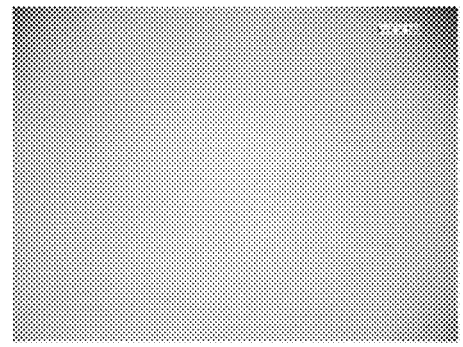
Figure 6B:
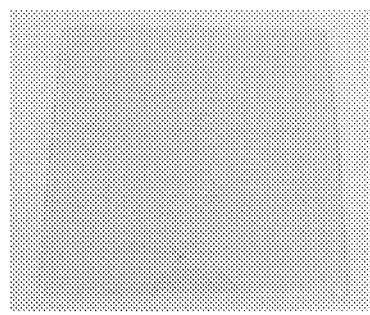
Figure 6B:
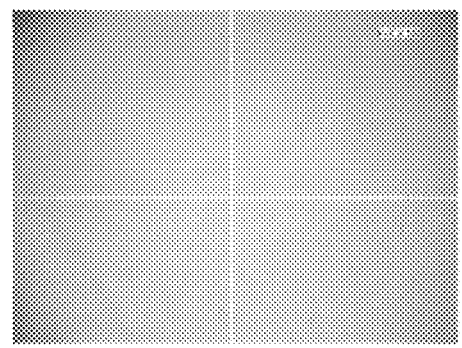

FIG. 6(a) shows a whole photograph of the PET substrate subjected to the plated wiring treatment in Comparative Example 2, and an optical microscope (VHX-900 from KEYENCE CORPORATION) image thereof. FIG. 6(b) shows a like photograph and optical microscope image of the substrate subjected to the treatment in Comparative Example 3.

As shown, Comparative Example 2 failed to form a plated wiring in a selective manner. Therefore, with the solution concentration increased, deposition has been barely confirmed, but dissolving/peeling has been confirmed in the case of exposure to a plated bath (hot water at 70° C.). This is believed to be because the photosensitive layer was not formed properly with poor adhesion to the substrate due to the fact that the material according to Example 1 has no adhesive functional groups unlike silane coupling agents.

While Comparative Example 3 has a plated wiring formed in a selective manner, it was confirmed visually that the compound became poorly soluble in the solvent with the passage of time, and finally insolubilized in the chloroform solution. This is believed to be because a condensation reaction proceeded after hydrolysis, thereby causing polymerization of alkoxysilanes to proceed.

[Evaluation of Surface Smoothness]

The smoothness of the substrate subjected to spin coating deposition was measured with the use of a surface roughness measurement system (P16 from KLA-Tencor Japan Ltd.). The surface roughness Ra of PET has a value of 2.78 nm, whereas the deposition substrates prepared according to Examples 5 to 7 respectively have Ra values of 2.20 nm, 2.17 nm, and 2.49 nm. From the foregoing, it has been successfully confirmed that the use of the surface treatment agent according to the present invention allows fox deposition without impairing the smoothness of the PET substrates.

From the foregoing results, the surface treatment agents according to the present examples have achieved sufficient adhesion without the use of any adhesion mechanism that utilizes inter-substrate or intermolecular condensation, unlike alkoxysilyl groups in silane coupling agents. In addition, due to the fact that there is no alkoxysilyl group or almost no alkoxysilyl group therein, there is no more increase in molecular weight after increasing the molecular weight up to a desired molecular weight, and a given molecular weight can be thus maintained in a solid or solution state, thereby providing long-term stability, and making it possible to extend the usable time, achieve highly reproducible deposition, and improve the environment resistance of the film itself. Thus, simplification of management, reduction in cost, and the like can be expected in the manufacture and conveyance of films for wiring formation, and in processes for manufacturing electronic materials and the like with the use of the films.

In addition, it has been determined that it is possible to apply highly fine electroless plated wirings to smooth substrates without using any resist even in low-temperature processes. Thus, it is possible to skip, for example, pretreatment, resist development, and resist peeling steps which use a lot of medical agents, and heating steps in respective steps including PEB, which require energy, and effects can be expected in terms of economics and environmental conservation.

Furthermore, when the present examples are used, transparent electrodes can be expected to be prepared inexpensively. Considering the formation of multilayer wirings for electronic devices and the like, which repeatedly implements the foregoing, the resist-free process is considered to have an extraordinary effect. In addition, when the reduced amounts of chemical substances used and short-step device manufacturing processes can be achieved according to the present invention, the effect of improvement in mass productivity/economics can be not only achieved, but also the burden can be reduced on development and maintenance of manufacturing systems. In addition, organic thin films provided according to the present invention function even as ultrathin films on the order of 2 to 10 nm, and thus have extremely low environmental burdens.

REFERENCE SIGNS LIST 11 substrate
12 photosensitive polymer layer 13 photomask
14 amine generation layer
15 catalyst layer
16 plating film

The invention claimed is:

1. A polymer compound comprising a constituent unit represented by the following formula (1):

[Chemical Formula 1]

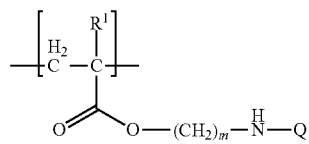
(1)

[in the formula (1), $R^1$ represents hydrogen or a methyl group, m represents an integer of 2 to 20, and Q represents a photosensitive leaving group],
wherein Q is at least one group represented by the following formula (2):

[Chemical Formula 2]

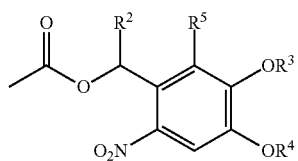
(2)

[in the formula (2), $R^2$ represents an alkyl group, $R^3$ and $R^4$ each independently represents an alkyl group or a fluoroalkyl group including a methyl group, and $R^5$ represents hydrogen or a nitro group].

2. The polymer compound according to claim 1, wherein the compound represented by the formula (1) has a number average molecular weight of 1000 to 5000.

3. The polymer compound according to claim 1, comprising no alkoxysilane.

4. The polymer compound according to claim 1, wherein at least one terminal of the compound represented by the formula (1) comprises a substitute represented by the following general formula (13):

[Chemical Formula 3]

(13)

5. The polymer compound according to claim 1, wherein terminals of the compound represented by the formula (1) comprise substitutes represented by the following formula (14) and the following formula (15):

[Chemical Formula 14 and 15]

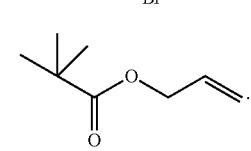
(14)

(15)

6. The polymer compound according to claim 1, wherein terminals of the compound represented by the formula (1) comprise substitutes represented by the following formula (16) and the following formula (17):

[Chemical Formula 16 and 17]

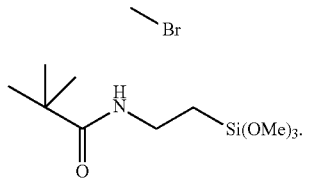
(16)

(17)

7. A surface treatment agent comprising the polymer compound according to claim 1.

8. A laminated body comprising the surface treatment agent according to claim 7.

9. A transistor comprising the surface treatment agent according to claim 7.

10. A method for manufacturing a laminated body, the method comprising the steps of: forming a photosensitive polymer layer by applying the surface treatment agent according to claim 7; exposing the photosensitive polymer layer to predetermined pattern light; providing a catalyst for electroless plating on the exposed region of the photosensitive polymer layer; and bringing the photosensitive polymer layer into contact with an electroless plating solution, thereby carrying out electroless plating.

* * * * *

UNITED STATES PATENT AND TRADEMARK OFFICE
CERTIFICATE OF CORRECTION

PATENT NO.        : 10,550,281 B2
APPLICATION NO.   : 15/659838
DATED             : February 4, 2020
INVENTOR(S)       : Yusuke Kawakami et al.

It is certified that error appears in the above-identified patent and that said Letters Patent is hereby corrected as shown below:

On the Title Page

Item [57], after "excellent" insert -- in --.

In the Claims

Column 20, Line 2, Claim 4, delete "[Chemical Formula 3]" and insert -- [Chemical Formula 13] --, therefor.

Signed and Sealed this
Twenty-fourth Day of March, 2020

Andrei Iancu
*Director of the United States Patent and Trademark Office*